(12) United States Patent
Ellinger et al.

(10) Patent No.: US 7,906,354 B1
(45) Date of Patent: Mar. 15, 2011

(54) LIGHT EMITTING NANOWIRE DEVICE

(75) Inventors: Carolyn R. Ellinger, Rochester, NY (US); Keith B. Kahen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/749,929

(22) Filed: Mar. 30, 2010

(51) Int. Cl.
*H01L 21/00* (2006.01)
*H01L 33/00* (2006.01)

(52) U.S. Cl. ............ 438/26; 257/99; 977/762; 977/832; 977/882

(58) Field of Classification Search .................. None
See application file for complete search history.

(56) References Cited

U.S. PATENT DOCUMENTS

| | | | |
|---|---|---|---|
| 7,132,677 B2 * | 11/2006 | Kim et al. | 257/14 |
| 7,202,173 B2 * | 4/2007 | Hantschel et al. | 438/694 |
| 7,714,351 B2 * | 5/2010 | Moon et al. | 257/103 |
| 2003/0168964 A1 * | 9/2003 | Chen | 313/495 |
| 2005/0227391 A1 * | 10/2005 | Jin et al. | 438/22 |
| 2007/0210704 A1 * | 9/2007 | Park et al. | 313/506 |
| 2007/0235738 A1 * | 10/2007 | Jin et al. | 257/79 |
| 2008/0210956 A1 * | 9/2008 | Kim | 257/88 |
| 2009/0146142 A1 * | 6/2009 | Kim et al. | 257/43 |
| 2009/0189144 A1 * | 7/2009 | Quitoriano et al. | 257/12 |
| 2010/0025673 A1 * | 2/2010 | Hu et al. | 257/43 |
| 2010/0051986 A1 * | 3/2010 | Min et al. | 257/98 |
| 2010/0180950 A1 * | 7/2010 | Gao et al. | 136/265 |

OTHER PUBLICATIONS

Lee et al, High-brightness gallium nitride nanowire UV blue light emitting diodes, Philosophical Magazine, vol. 87, Nos. 14-15, 2105-2115, May 2007.
Krames et al, Status and Future of High-Power Light-Emitting Diodes for Solid-State Lighting, Jour. of Display Technology, vol. 3, No. 3, Jun. 2007, pp. 160-175.
Zubia et al, Nanoheteroepitaxy: The Application of nanostructuring and substrate compliance to the heteroepitaxy of mismatched semiconductor materials, Journal of Appl. Physics, vol. 85, No. 9, May 1999, pp. 6492-6496.
Hersee et al, GaN nanowire light emitting diodes based on templated and scalable nanowire growth process, Electronic Letters, Jan. 2009, vol. 45, No. 1 pp. 75-76.
Fan et al, Wafer-Scale Assembly of Highly Ordered Semiconductor Nanowire Arrays by Contact Printing, Nano Lett 8, 1, 20 (2008).
Latu-Romain et al, A generic approach for vertical integration of nanowires, Nanotechnology 19, 2008.
Plass et al, Flexible Polymer-Embedded Si Wire Arrays, Adv. Mater. 21, 325-328, 2009.
Kelzenberg et al, Predicted Efficiency of Si Wire Array Solar Cells, Proc. 34th IEEE PVSC, 2009.
Huang et al, Well-aligned single-crystalline silicon nanowire hybrid solar cells on glass, Energy Mater. Sol. Cells, 2009.
Shiu et al, Transfer of aligned single crystal silicon nanowires to transparent substrates, Proc. of SPIE vol. 7047, 70470F, 2008.

\* cited by examiner

*Primary Examiner* — Scott B Geyer
(74) *Attorney, Agent, or Firm* — Raymond L. Owens

(57) ABSTRACT

Method of making a light emitting semiconductor nanowire device includes providing a plurality of spaced light emitting semiconductor nanowires on a growth substrate; applying a dielectric material disposed between the semiconductor nanowires producing a layer of embedded semiconductor nanowires having a top surface opposed to a bottom surface, wherein the bottom surface is defined by the interface with the growth substrate; depositing a first electrode over the top surface in electrical contact with the nanowires; joining the first electrode to a device substrate; removing the growth substrate and exposing the bottom surface of the layer of embedded nanowires; depositing a second electrode on the bottom surface of the nanowires so that it is in electrical contact with the nanowires; and wherein either the first or second electrode is transparent to permit light to be transmitted from the light emitting semiconductor nanowires through the transparent electrode.

18 Claims, 15 Drawing Sheets

LIGHT EMITTING NANOWIRE DEVICE

CROSS REFERENCE TO RELATED APPLICATIONS

Reference is made to commonly-assigned U.S. patent application Ser. No. 12/749,872 filed concurrently herewith, entitled "Integrated Semiconductor Nanowire Device" by Carolyn R. Ellinger et al and U.S. patent application Ser. No. 12/749,898 filed concurrently herewith, entitled "Photovoltaic Nanowire Device" by Carolyn R. Ellinger et al, the disclosures of which are incorporated herein.

FIELD OF THE INVENTION

The present invention relates to light emitting devices including semiconductor nanowires.

BACKGROUND OF THE INVENTION

Worldwide interest in light-emitting diode (LED) technology has rapidly increased over the past two decades. Starting with inorganic LEDs developed in the 60s, they have found their way into numerous lighting, signaling, and display applications, such as, automotive lighting, architectural lighting, flashlights, and backlights for LCD-based displays. Since the turn of the century they have started to appear in more mainstream lighting applications, which as a result of their long life and very high efficacy, will result in significant savings in energy usage. This set of applications include traffic signaling lights, street lights, and most recently, residential lighting.

In spite of the deepening penetration of inorganic LEDs into mainstream lighting, unresolved issues still remain, such as, high cost, poor color, and sub-desirable efficiency. Overall there are two ways for creating white LEDs (M. Krames et al., J. Display Technol. 3, 160 (2007)), combining blue, green, and red LEDs to form white LED arrays or combining a blue LED with appropriate down conversion phosphors to create a white light source. The first way yields a higher overall efficiency. Despite very high internal quantum efficiencies for red and blue LEDs of approximately 90 and 70%, respectively, the IQE of green LEDs at the desirable wavelengths of 540-560 nm is below 10%. This "green gap" issue has been recognized for many years (large strain develops in the active region as a result of incorporating sufficient indium in the GaN in order to form green emitting InGaN) and despite numerous efforts, still remains largely unresolved. Combining blue GaN LEDs with appropriate phosphors has recently yielded white LEDs with efficacies over 120 Lumens/Watt. Unfortunately, the correlated color temperature (CCT) of the corresponding white is typically high (>6000 K), yielding a cold light which lacks sufficient red response. Both inorganic LED approaches for white light, as of today, are approximately a factor of 100 too costly to engender significant market penetration into the residential market without significant government subsidies or incentives.

As discussed above, many issues still remain for inorganic LEDs (to be called LEDs) in lighting applications. Focusing on color-mixed LEDs (combining red, green, and blue LEDs), the two pressing issues are high cost and the sub-par performance of green LEDs. A large part of the high cost is associated with conventional LEDs grown on crystalline substrates, specifically sapphire or SiC for blue and green LEDs and GaAs for red LEDs.

Recently, there has been significant research activity towards creating nanowire-based LEDs, where the nanowires are grown using metal-organic vapor phase epitaxy (MOVPE) techniques by either a templated (S. Hersee et al., Electron. Lett. 45, 75 (2009)) or vapor liquid solid (VLS) approach (S. Lee et al. Philosophical Magazine 87, 2105 (2007)). The advantages of employing nanowires as LED elements are that they can be grown on inexpensive substrates (such as glass) and the amount of lattice mismatch that can be tolerated between LED layers is significantly higher when the crystalline material is a 20-100 nm thick nanowire as compared to bulk heterostructure growth (D. Zubia et al., J. Appl. Phys. 85, 6492 (1999)). However, device integration is a challenge with using nanowires as LED elements.

Researchers have been investigating forming LEDs, and other electronic devices, from nanowires by transferring the nanowires to a separate device substrate. The most common methods involve transferring nanowires so that they are horizontal, or parallel to the plane of the substrate, using techniques such as contact printing (Z. Fan et al, Nano Lett., 8, 1, 20 (2008)). There are many challenges in forming devices from horizontal nanowire arrays, including nanowire alignment and electrically contacting the wires to form useful circuits.

In answer to the challenges of horizontal nanowire array integration, there has been recent work to vertically integrate nanowires into electronic devices. Vertically integrated nanowire devices have been formed on the nanowire growth substrate by filling the spaces between the as-grown wires with a coatable dielectric material, such as a polymer or spin-on-glass, and subsequently adding electrodes (E. Latu-Romain, et al, Nanotechnology, 19 (2008)). One disadvantage of forming devices in this manner is that is difficult to make direct electrical contact to both ends of the nanowires.

There have been some advances in the photovoltaic field in forming structures containing vertically aligned silicon wires by removing the silicon wires from the growth substrate. Self-supporting films of silicon wires having diameters of 1.5-2 um and lengths of 75-100 um embedded within a PDMS matrix have recently been demonstrated (K. Plass, et al, Adv. Mater., 21, 325-328, (2009)). These films were formed by coating a PDMS solution over the growth substrate and then peeling the resultant embedded wire film from the substrate. Test devices have been formed from these films that demonstrate that electrical contact can be made to both ends of the wires. The article suggests that these films could be used to form solar cells by depositing a transparent electrode on a front surface, and a reflective metal electrode on the back surface of the film (Kelzenberg, M, et al, Proc. 34th IEEE PVSC (2009)). However, unlike the nanowires which are useful for LED devices, the Si wires useful for these photovoltaic devices have diameters that are a micron or greater and are many times longer than typical nanowires. A challenge still remains for integrating true nanowires that have submicron diameters of 5 to 500 nanometers with lengths of 2 to 10 microns, since these films would not be self supporting.

A prior art vertically integrated silicon wire device 255 is shown in FIG. 2. In the figure, a first electrode is 205, a second electrode is 210, a silicon semiconductor wire is 250 and a polymer dielectric is 230. The silicon wires 250 have diameters of 1.5-5 um and lengths of 75-100 um. The polymer dielectric 230 is PDMS. (K. Plass, et al, Adv. Mater., 21, 325-328, (2009)). The prior art vertically integrated silicon wire device 255 was formed by coating the PDMS over the wires and peeling the resultant embedded wire film from the growth substrate using a razor blade. The resultant embedded wire film is flexible and self supporting. The electrodes are then deposited on either side of the wire film. As previously noted, the silicon wires of this prior art example are not nanowires since their diameters are greater than 1 micron.

Solar cell devices structures with vertical silicon nanowires have been investigated by transferring silicon nanowires from the silicon growth substrate to a separate device substrate. These devices have been formed by embedding the silicon nanowires into a polymer matrix on a device substrate by using vertical pressure to push the nanowires into the polymer, and then shearing the nanowires from the growth substrate using a horizontal force (S. Shiu, et al., Proc. of SPIE Vol. 7047, 70470F, (2008)). In one instance nanowires were embedded into a functional polymer to create a hybrid solar cell where the nanowires enhanced the cell's performance (J.-S Huang, et al., So. Energy Mater. Sol. Cells (2009), doi:101.1165/j.solmat.2008.12.016). In the literature structures to date, the nanowires in these types of device structures have direct electrical connection to only one end. These methods are not of particular use to many applications, such as LEDs, since they do not solve the problem of how to make electrical connect to both ends of an array of semiconductor nanowires.

A second prior art vertically integrated semiconductor wire device 260 is shown in FIG. 3. As shown in the figure, the device 260 is formed on a growth substrate 270, over an optional buffer layer 280. The device 260 includes a first electrode 215, a second electrode 220, a semiconductor nanowire 240, and a dielectric 290. The semiconductor nanowires 240 have diameters in the range of 100 to 400 nm. The dielectric 290 can be a polymer or other coatable material such as spin-on-glass (SOG). This device structure requires patterning of the embedded nanowire layer in order to separate the devices and to create an open area on the buffer layer for depositing the second electrode. In order to pattern the embedded nanowire layer, two process steps are required due to the different etch chemistries necessary for the semiconductor and dielectric. The wires of this second prior art example are nanowires, however the device structure fails to solve one of the fundamental problems in forming vertically integrated semiconductor nanowire devices, that of making direct contact to either end of the nanowires.

Consequently, in spite of the technological advances in device architecture and methods, problems remain in generating quality vertically integrated light emitting semiconductor nanowire devices.

SUMMARY OF THE INVENTION

It is an object of this invention to provide a method for forming integrated light emitting nanowire devices. In comparison with other light emitting nanowire devices, the nanowires are vertically integrated and have direct electrical connection at either end. This object is achieved by a method of making a light emitting semiconductor nanowire device comprising:

(a) providing a plurality of spaced light emitting semiconductor nanowires on a growth substrate;

(b) applying a dielectric material so that it is disposed between the semiconductor nanowires producing a layer of embedded semiconductor nanowires having a top surface opposed to a bottom surface, wherein the bottom surface is defined by the interface with the growth substrate;

(c) depositing a first electrode over the top surface of the layer of embedded semiconductor nanowires so that it is in electrical contact with the semiconductor nanowires;

(d) joining the first electrode to a device substrate;

(e) removing the growth substrate and exposing the bottom surface of the layer of embedded semiconductor nanowires;

(f) depositing a second electrode on the bottom surface of the layer of embedded semiconductor nanowires so that it is in electrical contact with the semiconductor nanowires; and (g) wherein either the first or second electrode is transparent to permit light to be transmitted from the light emitting semiconductor nanowires through the transparent electrode.

DETAILED DESCRIPTION OF THE INVENTION

It is desirable to form semiconductor optoelectronic and electronic devices that not only have good performance, but also are low cost and on flexible arbitrary substrates.

The term nanowires as used herein refers to nanocrystals with aspect ratios of at least 10:1 (length:diameter), diameters of less than 1 um, and lengths from 500 nm to tens of microns. Semiconductor nanowires 100 useful in the present invention have diameters preferably less than 500 nm and most preferably less than 100 nm and lengths preferably 2 to 10 microns. As is well known in the art, semiconductor nanowires 100 can be grown by the vapor-liquid-solid (VLS) processes. Vapor-based VLS techniques have been performed using either molecular beam epitaxy (MBE) or metal-organic vapor phase epitaxy (MOVPE). The MBE technique can result in very high quality semiconductors being formed, however, it is a very expensive growth technique and as a result is limited to research scale investigations. MOVPE is currently used worldwide to form commercial high quality III-V LEDs and lasers. Using semiconductor nanowires as the building blocks for semiconductor devices would result in optoelectronic and electronic devices that are advantaged for cost and green gap LED performance over their conventional growth counterparts. The devices below will focus on integrating II-VI semiconductor nanowires grown by VLS techniques using MOVPE equipment; however this should not be considered limiting.

Figure 1:
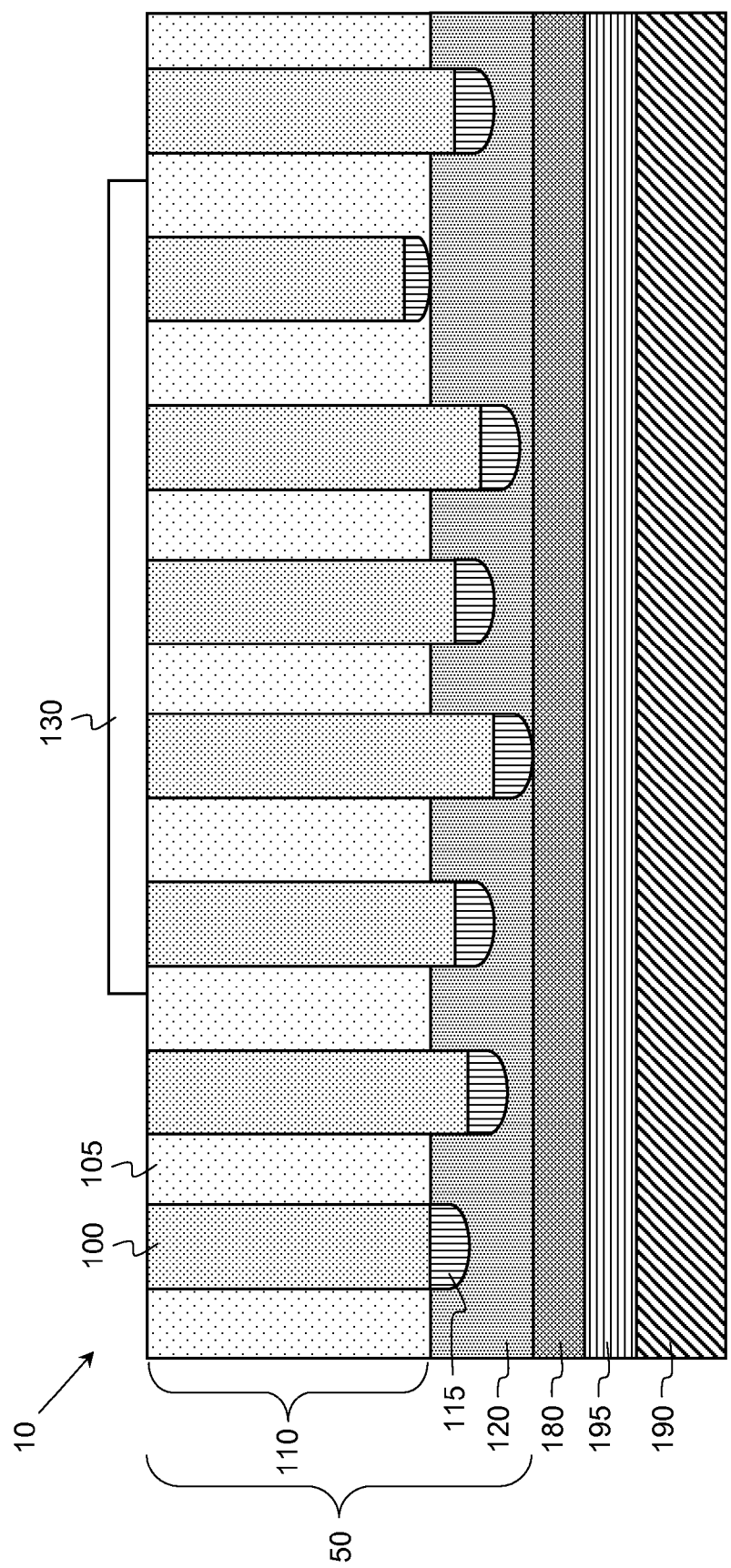
FIG. 1 shows a schematic of the inventive vertically integrated semiconductor nanowire device.
Figure 2:
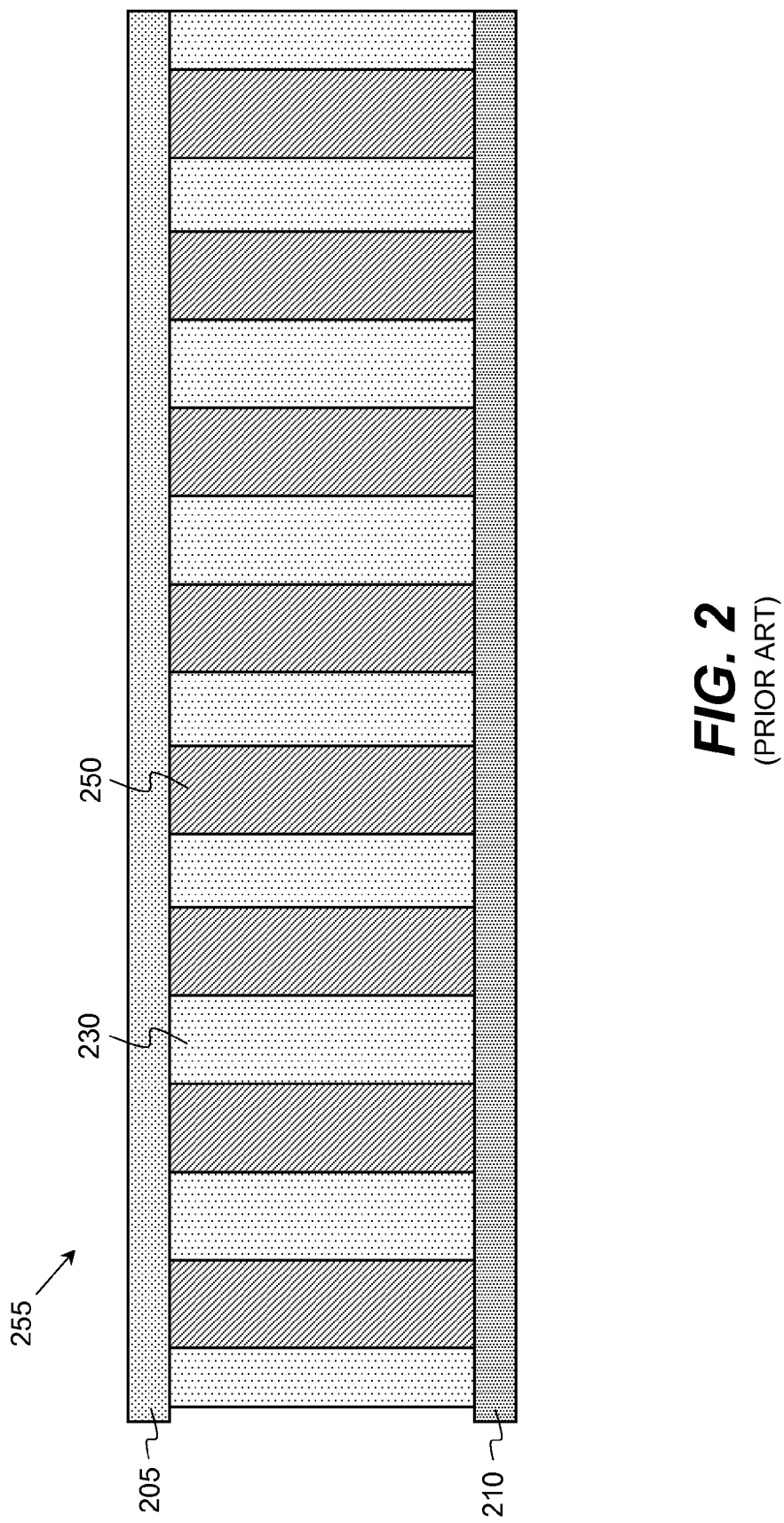
FIG. 2 shows a schematic of a prior art silicon wire device.
Figure 3:
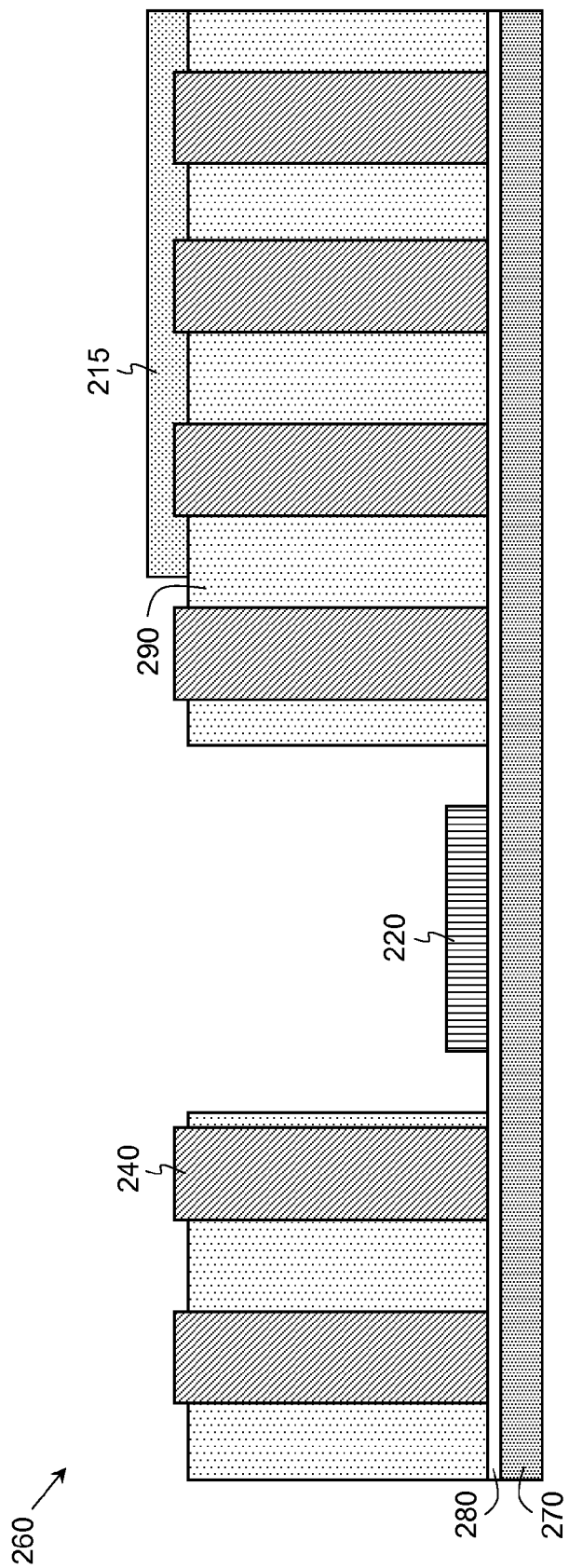
FIG. 3 shows a schematic of a prior art semiconductor nanowire device.

Unlike the prior art examples, the inventive vertically integrated nanowire device 10 shown in FIG. 1 has direct metal connection to both ends of the semiconductor nanowires 100. The device 10 has a layer of embedded semiconductor nanowires 110, with semiconductor nanowires 100 embedded in a dielectric 105. Electrical connection is made to either side of the embedded semiconductor nanowires 110 with a first electrode 120 which is electrically and physically connected to a device substrate 190 by a conductive connection material 180. Preferably, the device substrate 190 is conductive. As shown in FIG. 1, the device substrate 190 can include a metallization layer 195 if the bulk of the device substrate 190 is insulating. The device substrate 190 shown in FIG. 1 is not a growth substrate 200 (FIG. 5) used to grow the semiconductor nanowires 100.

Vertically integrated semiconductor nanowire devices 10 can be formed with semiconductor nanowires 100 that were formed by any growth method where wires are grown attached to the growth substrate 200, such as either MOVPE or MBE, however it is preferable that the semiconductor nanowires 100 are substantially vertical. The semiconductor nanowires 100 of the present invention can be type II-VI, III-V, IV-VI or IV semiconductors. They can be simple binary compounds, such as, ZnSe or CdTe or GaN, more complex ternary compounds, such as, ZnSeS or CdZnSe, or even quaternary compounds, such as, ZnMgSSe or ZnMgSeTe. In some cases, the material composition of the semiconductor nanowire 100 will be uniform along its length, in others the material composition can be varied discretely along its length, such as wires with discrete internal heterostructure units using growth techniques that are well known in the art. In some cases the discrete heterostructure units will be uniform in composition; in others, the material composition will smoothly vary from one composition to another, such as, from $ZnSe_{0.5}S_{0.5}$ to ZnS. With regard to semiconductor nanowires 100 with very small thicknesses, 10 nm thick nanowires can be made routinely by methods well known in the art. Sub 10 nm thick nanowires are more difficult to produce since they require equally small metal nanoparticles 115.

The semiconductor nanowires 100 are grown directly on the growth substrate 200. The growth support 200 can be any material structure which can withstand the growth temperatures, for example, up to ~400° C. for shelling materials of II-VI nanowires grown via MOVPE. The growth substrate 200 can be a single material such as glass, semiconductor substrates, such as Si or GaAs, metal foils, or high temperature plastics that can be used as supports. Optionally, the growth substrate 200 can include a low energy surface film to enhance the selectivity of the nanowire growth. As is well known in the art, typical low energy surface films are oxides, such as, silicon oxide and aluminum oxide. For VLS wire growth using MOVPE, each semiconductor nanowire 100 is attached to the growth substrate 200 at one end. Single semiconductor nanowires 100 are spaced from neighboring nanowires within an array of nanowires on the growth substrate 200. For nanowires grown via VLS methods the space between each of the nanowires on the growth substrate 200 is determined by the initial spacing between the metal nanoparticles 115. For nanowires formed via a templating method, the space between adjacent nanowires is set by the template. As shown in FIG. 1, the free end of each VLS grown semiconductor nanowire 100 is terminated in a metal nanoparticle 115. The metal nanoparticle 115 will typically: 1) have a melting point of ~330° C. and less; 2) enable localized growth of the nanowires; 3) not dope the nanowires; and 4) be non-toxic. These metal nanoparticles 115 can remain in the final vertically integrated semiconductor nanowire device 10, as shown in FIG. 1, or can optionally be removed prior to device completion (not shown). The semiconductor nanowires 100 can contain dopants in order to modify the conductivity of the nanowires. As is well known in the art, the dopants can be either n-type or p-type. For nanowires with heterostructure units, the dopant level and types can differ between the various discrete heterostructure units. More specifically, each discrete heterostructure unit can have a different dopant species, type (n- or p-), and concentration, with some discrete heterostructure units being nominally undoped (or intrinsic regions). Overall the distribution of dopants is selected, as is well known in the art, in order to obtain specific properties for the semiconductor nanowires 100.

Figure 4:
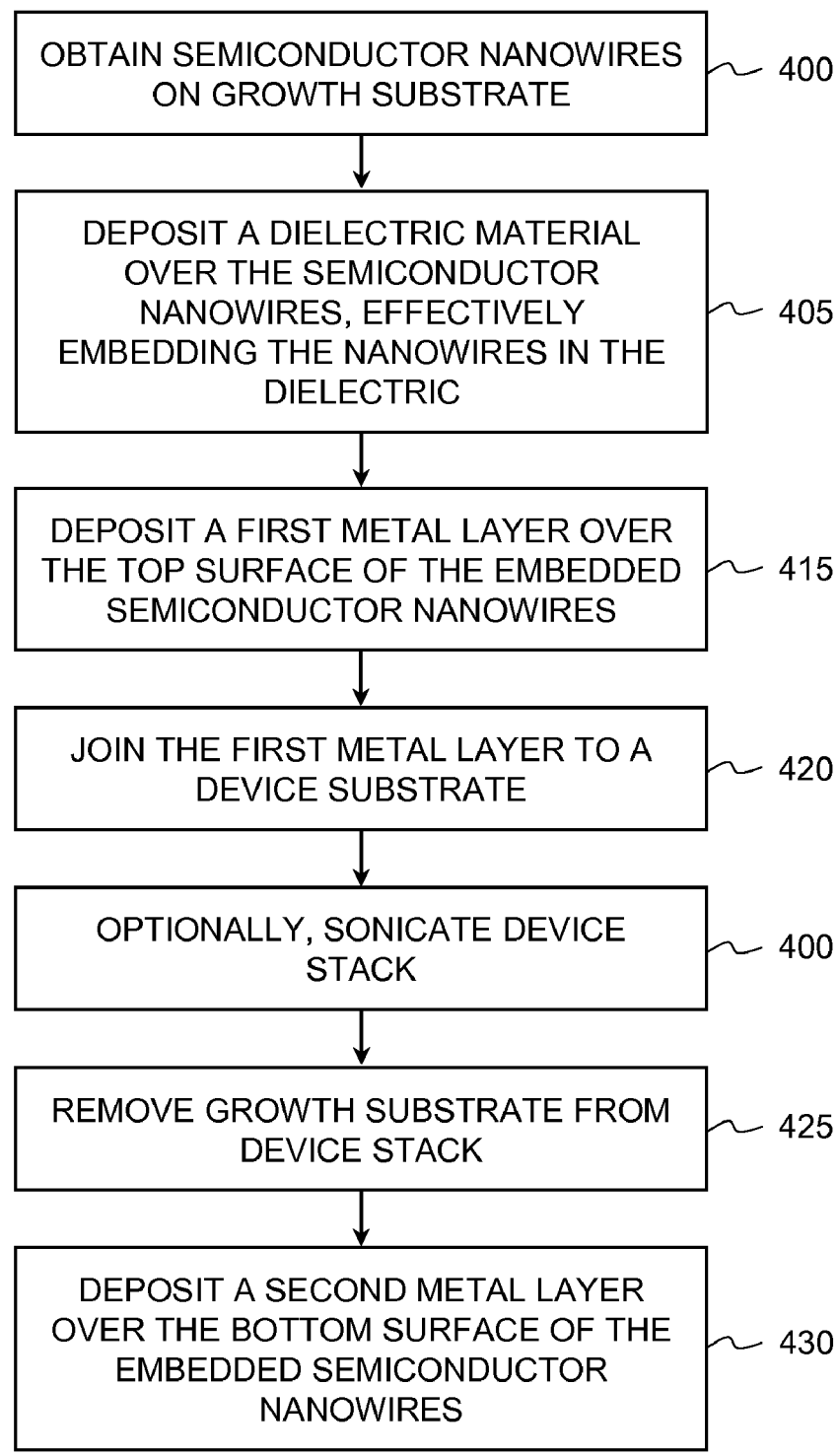
FIG. 4 shows one process flow for creating the integrated semiconductor nanowire device of FIG. 1.

The inventive method for forming the novel vertically integrated semiconductor nanowire device uses a vertical transfer method of the semiconductor nanowires 100 to the device substrate 190. FIG. 4 shows an outline of the steps for making the vertically integrated semiconductor nanowire device of the present invention. In the first step 400, as-grown semiconductor nanowires are obtained, still attached to their growth substrate 200. The semiconductor nanowires 100 can be type II-VI, III-V, IV-VI, or IV nanowires that were formed by any growth method, such as either MOVPE or MBE, where wires are grown attached to a growth substrate. The semiconductor nanowires 100 can be formed using catalyzed growth methods such as VLS or SLS. The semiconductor nanowires 100 can be a single material, or a core/shell. Preferably, the semiconductor nanowires 100 are substantially vertical. The semiconductor nanowires 110 can vary in height as shown in FIG. 1, but are preferably within 10% of uniform height. Preferably, each semiconductor nanowire 100 is individually functional. For example, for an integrated light emitting nanowire device each nanowire would be a nano-scale light emitting diode (LED).

Figure 5A:
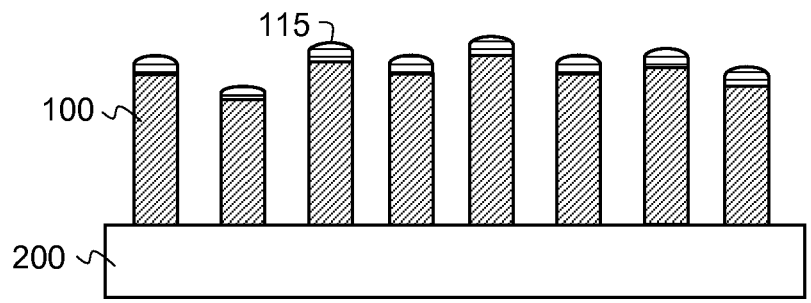
FIGS. 5a.-5f illustrate the device structure after various steps in the process flow of FIG. 4.
Figure 5B:
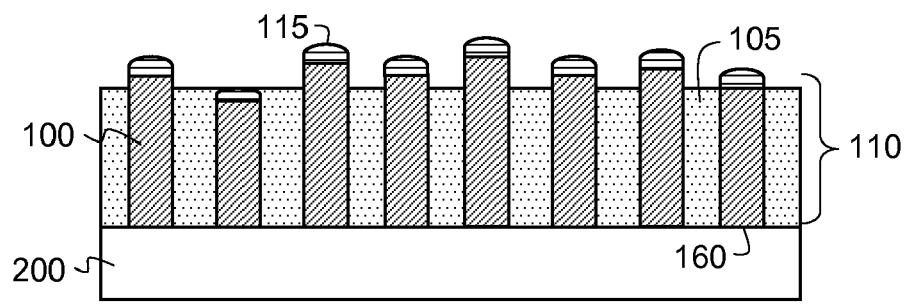
Figure 5C:
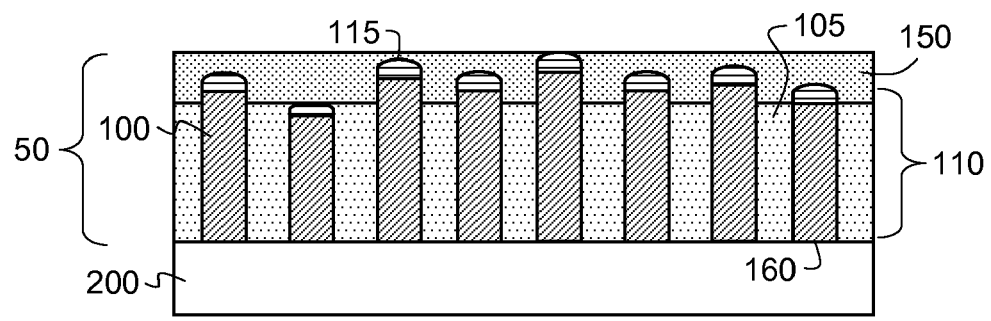

In the second step 405 of FIG. 4, a dielectric material 105 is deposited over the semiconductor nanowires 100 creating a layer of embedded semiconductor nanowires 110. As shown in FIG. 5b, this layer of embedded semiconductor nanowires 110 has a top surface 150 opposite a bottom surface 160, where the bottom surface 160 is defined by the nanowire interface with the growth substrate 200. The top surface 150 of the embedded semiconductor nanowire layer 110 includes the nanowire tips and the top surface of the dielectric material. The dielectric 105 can be any dielectric material that when coated over the nanowires will flow into the spaces between the nanowires, and after curing or other processing is a solid forming the embedded semiconductor nanowire layer. Examples of dielectric 105 materials useful in the present invention include polymeric materials such as PDMS, polyimides or acrylates like SU8, or inorganic sol-gel materials such as spin-on-glass (SOG). After depositing the dielectric 105, the material can require additional processing to cure the material to a final state. This processing can include photo-exposure (UV or IR), heating, hard baking, or chemical processing. For example, when using SU8, after coating the SU8 solution the material can be cross-linked by a standard UV exposure and hard bake process or simply a high temperature cure.

After coating the dielectric 105 in the second step 405, there can be residual dielectric material on the tops of the nanowires. It is preferable to remove this material from the nanowire tops prior to depositing the metal in order to make good electrical contact. The method of removing the dielectric material is specific to the type of material used. For polymer dielectric materials, such as SU8, a short exposure to an $O_2$ plasma is sufficient to clean the nanowire tops. Some methods of nanowire growth leave the metal nanoparticles 115 attached to the wire tips. As previously mentioned, this metal can be left on the wire tips and integrated into the device as shown in FIGS. 5a-5f, or optionally removed either before or after coating and curing the dielectric material 105. Depending on the composition of the as-grown semiconductor nanowires, it can be desirable to modify the dopant level at the wire tops in case insufficient doping is not possible during the in-situ growth steps. In these cases, diffusion doping processes can be carried out after the curing of the dielectric 105 and material removal from the wire tips. These diffusion processes need to be carried out below the $T_g$ of the dielectric material, so careful selection of the dielectric material in these instances is critical.

Referring back to FIG. 4, the third step 415 includes depositing a metal first electrode 120 to make contact to the tops of the nanowires. As used herein, electrode can refer to a single metal, an alloy, or a multilayer stack of metals or alloys. A partial device stack 50 after depositing the first electrode 120 is show in FIG. 5c. It is preferred that the metal for this first electrode be selected as to make ohmic contact to the exposed semiconductor material of the nanowires.

Figure 5D:
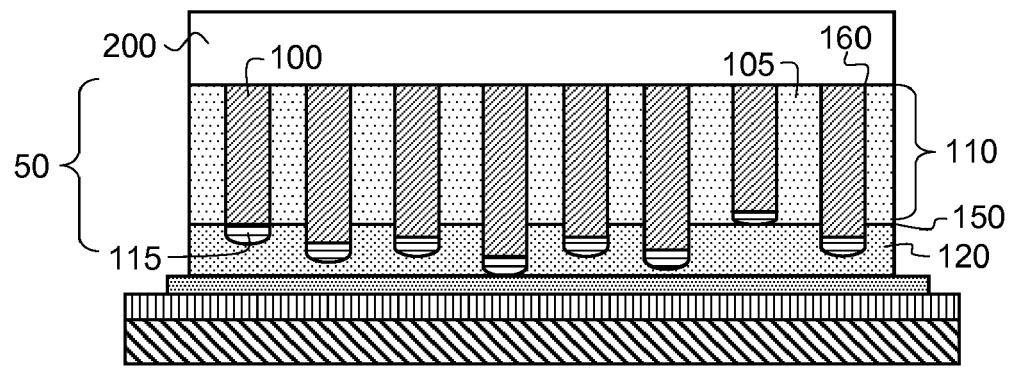

To make contact to both the top and bottom of the semiconductor nanowires, the nanowires need to be transferred to a separate device substrate 190. Step 4 420 of FIG. 4 calls for joining the first electrode 120 to the device substrate 190. Preferably the surface of the device substrate 190 is conductive, either inherently as in the case of stainless steel or was previously metalized as in the case of inherently insulating substrates such as polyimide films or glass. Preferably, the device substrate 190 is flexible. In instances where the device substrate 190 is flexible, it is preferred that the conductive connection material is also flexible and ductile. The joining preferably forms both a mechanical and electrical connection using the conductive connection material 180. In one example of joining using a metallic conductive connection material 180 via a flux-less solder process, DuPont™ Kapton® polyimide film with a Ag metallization layer 195 is used as the device substrate 190. Indium or other low melting point metal or alloy is used as the conductive connection material 180 and is melted on the silvered surface of the Kapton®. The first electrode 120 surface of the nanowire device stack is pressed into the liquid Indium, and then allowed to cool forming a mechanical and electrical bond between the partial device stack 50 and the device substrate 190. This structure is show in FIG. 5d. The combination of the first electrode 120, the conductive connection material 180, and the conductive surface of the device substrate 190 form a common electrode for the vertically integrated semiconductor nanowire device 10. The device substrate 190 is preferably larger than the area of nanowires to be transferred. As shown in FIG. 5d, when the device substrate 190 is larger than the nanowire area a portion of the conductive surface of the substrate is exposed permitting easy electrical connection to the common electrode.

Figure 5E:
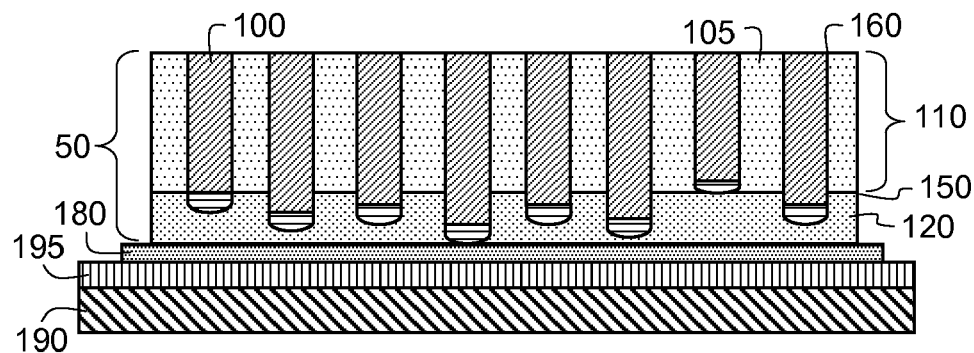
Figure 5F:
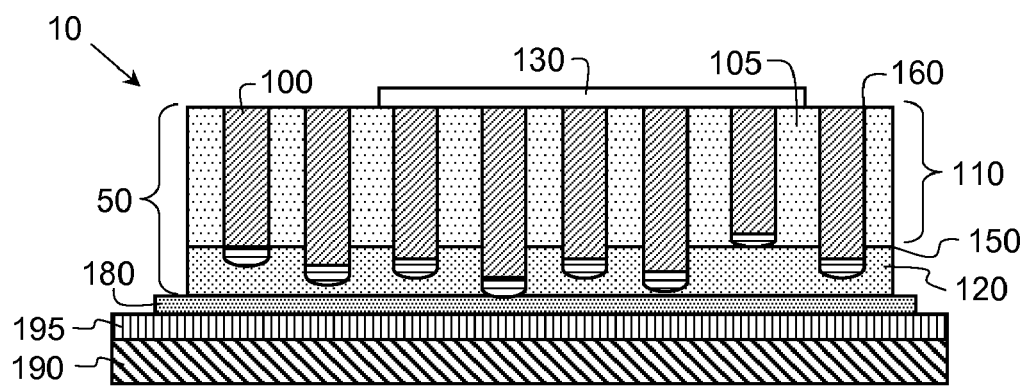

Removing the growth substrate 200 from the partial device stack 50 is Step 5 425 of FIG. 4. Removing the growth substrate 200 exposes the bottom surface 160 of the layer of embedded semiconductor nanowires 110 as shown in FIG. 5e. The method of removal of the growth substrate 200 is dependent on the mechanical properties of the nanowire—growth substrate interface and the flexibility of the device substrate 190. In some cases with a flexible substrate such as Kapton®, the layer of embedded semiconductor nanowires 110 can simply be peeled from the growth substrate 200 using mechanical force. In some cases, however, the force required to remove the nanowires from the growth substrate 200 is greater than the force required to break the bond to the device substrate 190; this causes the embedded semiconductor nanowire layer 110 to remain on the growth substrate 200 while the device substrate 190 is peeled away. In order to ensure that the embedded semiconductor nanowire layer 110 is removed cleanly from the growth substrate 200, additional energy can be added to the system to weaken the interface. It has been found that sonication is an effective method of weakening the interface of the embedded semiconductor nanowire layer 110 with the growth substrate 200. The sonication of the present invention can be done in water or any other compatible solvent. In some examples, the sonication energy can be adjusted such that the embedded semiconductor nanowire layer 110 separates from the growth substrate 200 with no additional force. In the cases of rigid device substrates 190, this would be a preferred method of removing the growth substrate 200 from the partial device stack 50.

After removing the partial device stack, the second electrode 130 is deposited on the bottom surface 160 of the embedded 50 semiconductor nanowire layer 110, Step 6 430 of FIG. 4. The second electrode 130 is preferably deposited in a pattern-wise manner to form multiple devices within the area of the transferred embedded semiconductor nanowire layer 110. The second electrode 130 can be a single metal, an alloy, or stack of multiple metals or alloys.

Figure 6:
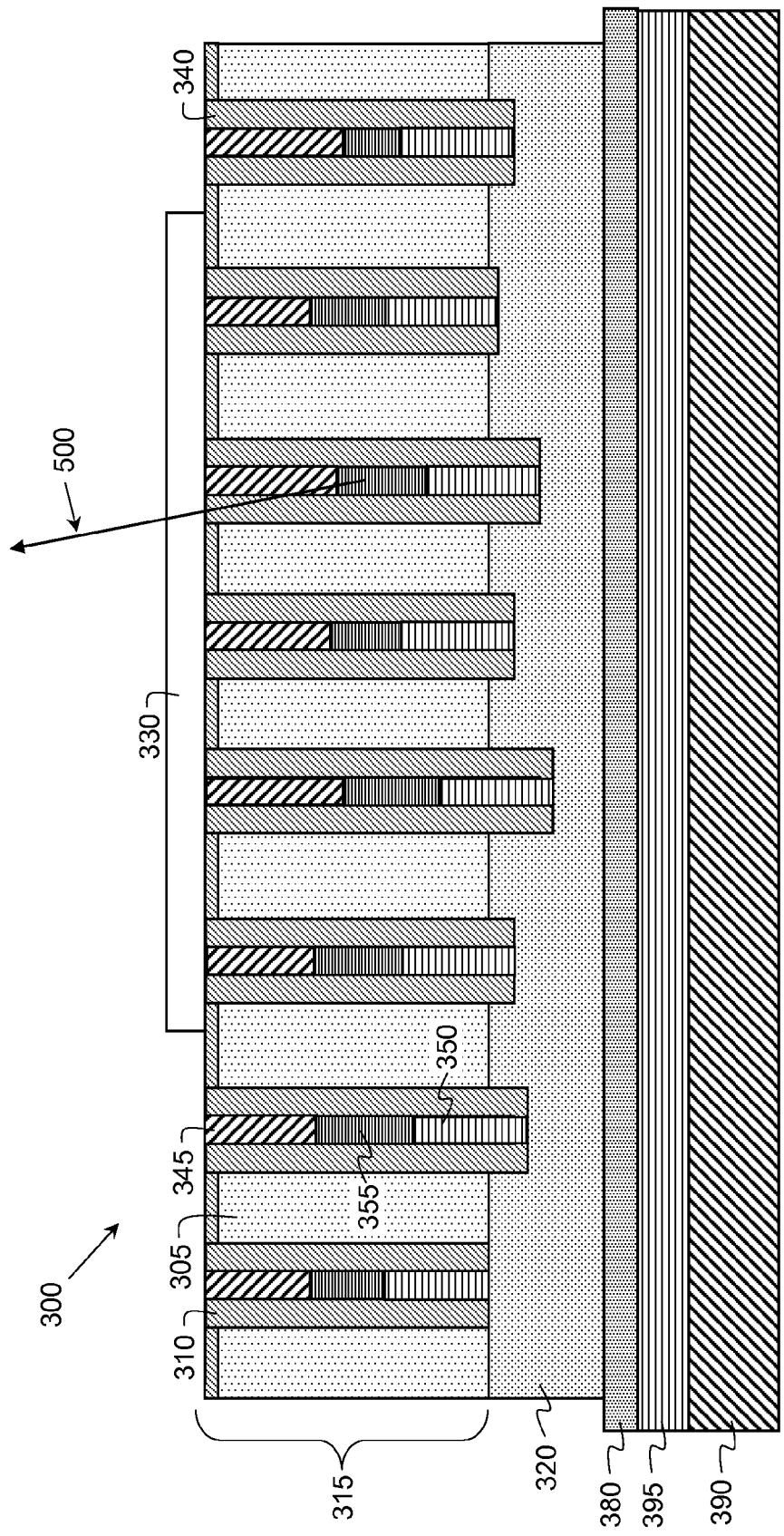
FIG. 6 shows an integrated light emitting semiconductor nanowire device of the present invention with core/shell nanowires.

FIG. 6 shows an example of an integrated light emitting semiconductor nanowire device 300. As shown in FIG. 6, the light emitting semiconductor nanowires 310 are core/shell nanowires. The LED semiconductor nanowire device 300 has a layer of embedded light emitting semiconductor nanowires 315, with light emitting semiconductor nanowires 310 embedded in a dielectric 305. Electrical connection is made to either side of the embedded light emitting semiconductor nanowires 315 with a first electrode 320 which is electrically and physically connected to the device substrate 390 by a conductive connection material 380, and a second electrode 330. Preferably, the device substrate 390 is conductive. As shown in FIG. 6, the device substrate 390 can include a metallization layer 395 if the bulk of the device substrate is insulating. Each nanowire 310 is an LED, i.e. if electrical contact is made to both ends of any individual wire, the wire acts as a functional LED. Light emitting diode (LED) nanowires having a variety of structures can be integrated into light emitting nanowire devices.

As shown in FIG. 6, the LED nanowires 310 are core/shell nanowires where the core of the nanowire is a pin diode with a p-type region 350, an intrinsic region 355 (nominally undoped) and an n-type region 345. In this device, the light 500 is mainly emitted from the intrinsic region. The shell 340 is a wider bandgap material than the regions of the core and serves to mitigate core region surface defects. The shell 340 can also aid in quantum confinement for nanowires when the core materials Bohr exiton radius is on the order of the nanowire core diameter. As shown in FIG. 6, there is a single intrinsic region 355 for light emission; however the pin diode structure can also have multiple quantum well regions for light emission. Additionally, multiple quantum well regions can be incorporated into either the p-type or n-type regions to aid in doping. The n-type region 345 and p-type region 350 are formed using dopants that are n-type or p-type respectively. For II-VI materials, some of the demonstrated n-type dopants 224 are Al, In, Ga, Cl, Br, and I. The highest doping levels are typically obtained with the column VII elements substituting for the chalcogens, for example, Cl substituting for Se in ZnSe. An effective n-type dopant for MOVPE applications is Cl since precursors, such as, butyl chloride, are easy to use, readily available, and doping levels in the $10^{18}$ cm$^{-3}$ range can be obtained. With regard to p-type dopants, column I or column V elements have been successfully implemented for II-VI materials. Representative column I elements are Li and Cu, while representative column V elements are N, P, and As. In addition to these elements, Li$_3$N has been demonstrated to be an effective p-type dopant for II-VI materials.

As shown in FIG. 6, the p-type regions 350 are at the top of the wires, and the n-type regions 345 were formed at the growth substrate. This should not be considered limiting, and light emitting semiconductor nanowires 310 with the n-type regions 345 at the wire tops and p-type regions 350 at the growth substrate are also useful. In general, dopants can be incorporated during nanowire growth or incorporated post-growth by using diffusion processes. Particularly, when doping the region at the top of the wire, when necessary, it is practical to dope after growth using diffusion. As mentioned above, a diffusion doping processes can be carried out after the curing of the dielectric 305 and material removal from the wire tips and prior to removing the nanowires from the growth substrate 200.

ZnSe based nanowires are an example of II-VI semiconductor nanowires. One useful ZnSe-based light emitting nanowire has an n-type region that is chlorine doped ZnSe, an intrinsic region with multiple quantum wells of CdZnSe interspersed with ZnSe barrier material and a p-type region of phosphorus doped ZnSeTe (Te content of ~50%). These wires can be made via a vapor liquid solid (VLS) process, with growth by MBE or MOVPE, with MOVPE as the preferred process due to the lower manufacturing costs associated with MOVPE growth processes. Using a single MOVPE reactor and metal catalyst nanoparticles, the different regions and quantum wells are formed by controlling the gas flow of semiconductor and dopant precursors that are selectively chosen and switched in order to get the proper compositions, thicknesses, and dopings. By changing the growth conditions, the light emitting cores are then shelled with a higher band gap material, such as ZnSeS. As shown in FIG. 6, when shelling the nanowires the shell material 340 can partially fill in the spaces between the nanowires and be transferred to the final device when transferring the nanowires 310 from the growth substrate (not shown) to the device substrate 390.

III-V semiconductor LED nanowires are also useful in this invention. For example pin diodes formed from GaAs, GaN, InGaN, or InP cores and their associated dopants. Common p-type dopants for III-V materials include Zn and Mg, and common n-type dopants are Si or Se. Nanowires from the III-V material system can also have a core/shell structure with materials chosen to have appropriate band gap and crystal lattice properties.

As illustrated in FIG. 6, the light emitting nanowires 310 are core/shell light emitting nanowires. Although the shell is useful in mitigating the effects of core-region surface defects, it is optional and useful devices can be made formed using LED nanowires that do not have a shell. As shown, the light emitting nanowires 310 have cores that are axial pin diodes, grown so that the core composition varies in the axial direction but is uniform in the radial direction. Light emitting nanowires having radial pin diode structures are also useful in the present invention. In radial pin diode nanowires, the interface between two adjacent regions is in the radial direction; the composition of a radial pin diode nanowire varies in the radial direction, but is constant in the axial direction. One useful radial LED nanowire structure has a core which is the p-type region, an intrinsic quantum well region as the inner shell around the core, and a wide band gap n-type semiconductor as the outer shell.

The integrated light emitting nanowire device 300 is formed by the same process as described in reference to FIG. 4 and FIGS. 5a-5f. When forming the integrated light emitting nanowire device 300 shown in FIG. 5f, the selection of the metal is important to reduce contact resistance. Preferably, the contact between the doped regions and their associated metal is ohmic. However, it is additionally important that one of the electrodes be transparent in order to permit light 500 to be emitted from the device. For the purpose of the present application, transparent is defined as having 80% or more transmittance integrated over the spectral range of interest; for LED devices the spectral range of interest is the emission bandwidth. Common transparent materials are transparent conductive oxides such as Indium-Tin Oxide (ITO) or Indium-Zinc Oxide (IZO). Thin metal layers are also useful in forming transparent contacts that are ohmic. As illustrated in FIG. 6, the metal catalyst nanoparticle and a portion of the shell has been removed from the tops of the wires in order to facilitate contact to the doped region in the core. However, if the shell is properly doped and appropriate metal contacts are chosen, then, as is well known in the art, etching the tops of the nanowires becomes unnecessary. In reference to FIG. 6, for ZnSe based light emitting nanowires 300, the first electrode 320 is selected to be Pd/Ag using the Pd to make ohmic contact with p-ZnSeTe. The second electrode 330 is transparent, and can be formed from a thin layer of evaporated In and a thicker coating of ITO. In this case, a good conductive connection material is In and one useful metallization layer is Ag. These choices should not be considered limiting, but are rather an example of appropriate contact metals.

The following examples are presented as further understandings of the present invention and are not to be construed as limitations thereon.

Example 1

Figure 7:
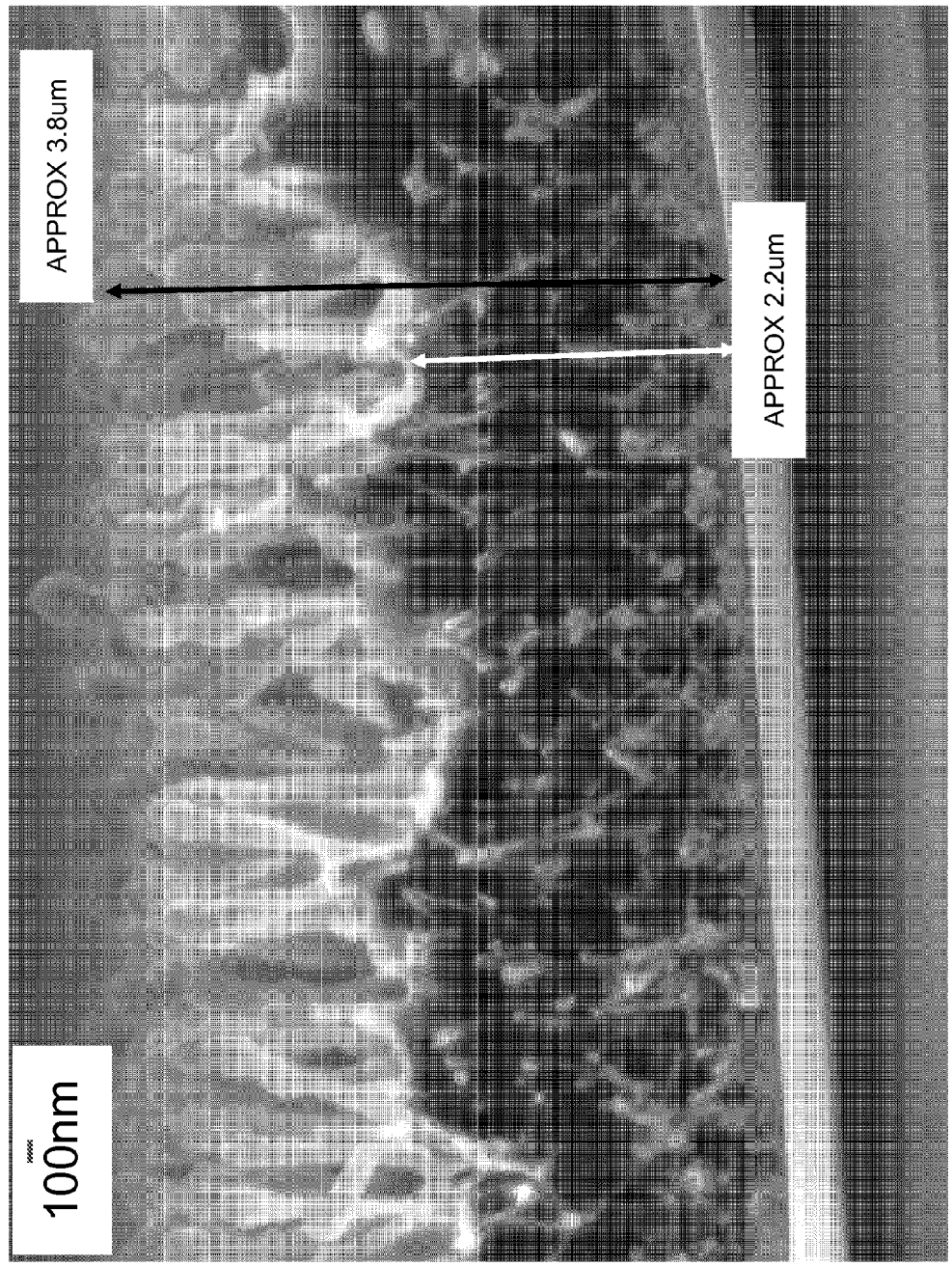
FIG. 7 shows a scanning electron microscope image of an array of ZnSe/ZnSeS core/shell nanowires prior to being removed from the growth substrate.

In this example an integrated nanowire device was formed on a flexible Kapton® substrate using core/shell ZnSe/ZnSeS nanowires. The ZnSe/ZnSeS nanowires were grown on a Si substrate having a low energy surface film of silicon oxide via a VLS route using a gold-tin alloy as the metal catalyst. The ZnSe/ZnSeS nanowires have average lengths on the order of 4-5 um and diameters on the order of 50-75 nm. After growth, the nanowires were coated with an SU8 solution of 4:1 SU8 2000.5:2010 by weight via spin coating. The SU8 coating was cured by a pre-bake at 95° C. for 1 min, a blanket UV exposure, and a post exposure bake for 2 minutes at 95° C. The sample then underwent a final hard bake in a tube furnace under nitrogen flow for 30 minutes at 325° C. Using a barrel asher, the samples were subjected to a short oxygen plasma to remove the SU8 from the tips of the wires. After SU8 removal Pd/Ag was deposited as the contact to the wire tops. FIG. 7 is a representative cross-section of a sample at this stage in the process.

In order to make contact to the bottom of the nanowires, the wires were transferred to a metalized Kapton® substrate whose top surface had approximately 1 um of Ag. Using 0.002" In foil, the metal coated nanowires were joined to the metalized Kapton® substrate using a 180° C. hotplate. The solder (joining) process is essentially as follows: place the metalized Kapton® onto the hotplate, place In foil on the metalized Kapton® and allowed to melt, place the metal coated nanowire tips into the molted In, then remove Kapton®-nanowire stack from the hotplate and allowed to cool. After the joining process, the tops of the wires are connected to the Kapton® by a stack of four metals: 1) the Ag on the Kapton® surface, 2) the In conductive connection material, 3) the Ag on the wire tops, and 4) the Pd deposited on the wire tops for ohmic contact. To complete the transfer of the embedded nanowires to the Kapton®, they were peeled from the Si growth substrate by pulling on the Kapton® substrate, much as if peeling scotch tape. The $SiO_2$ surface of the Si growth substrate appears clean both visually and in SEM images. The second electrode of the integrated nanowire device was deposited by evaporating In and then sputtering ITO through a shadow mask. Multiple devices were formed using the shadow mask to form the second electrode, all with the Ag/In/Ag/Pd stack as a common first electrode.

Figure 8:
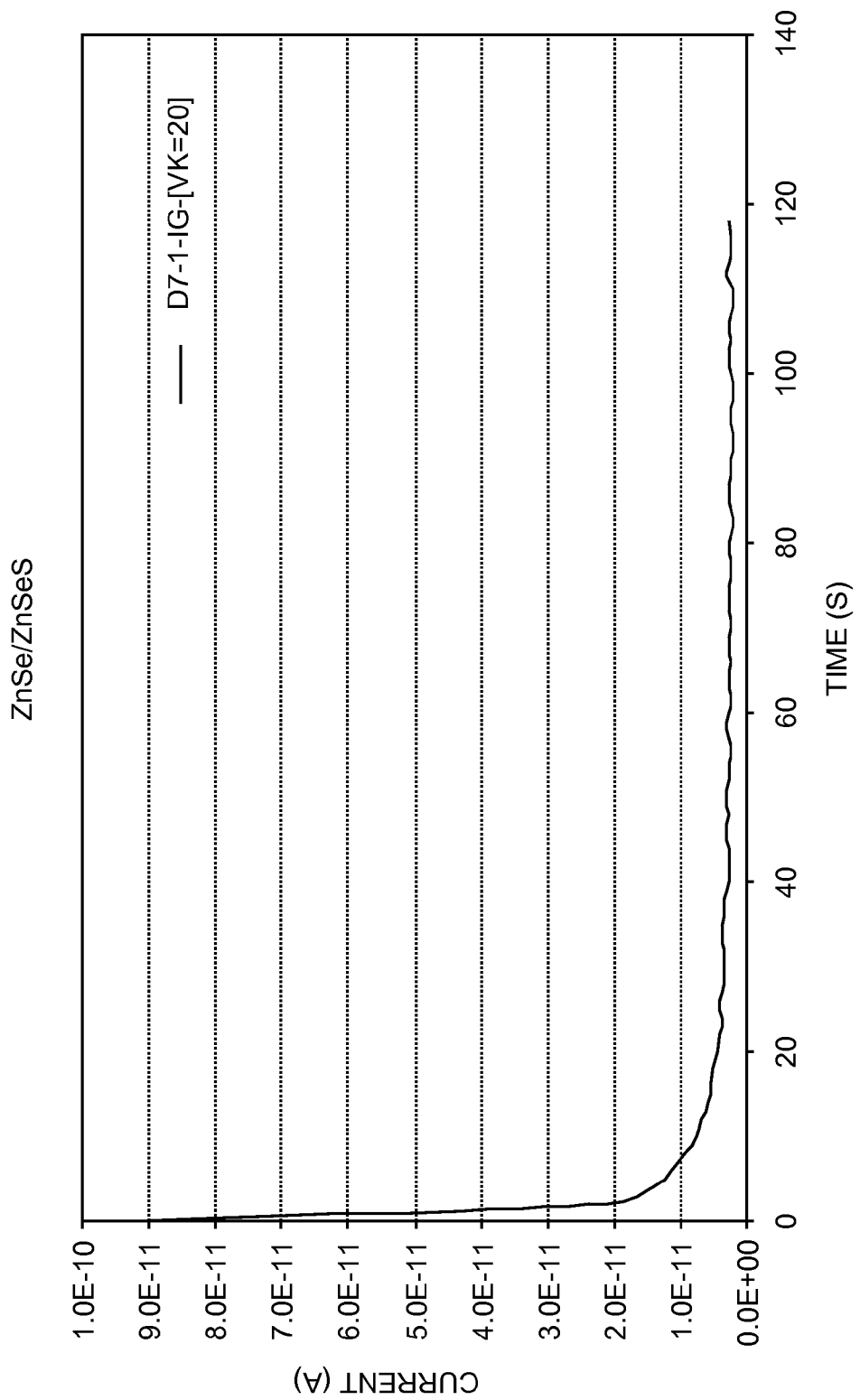
FIG. 8 shows the current as a function of time for a constant voltage bias for an integrated semiconductor nanowire device containing an array of ZnSe/ZnSeS core/shell nanowires.
Figure 9:
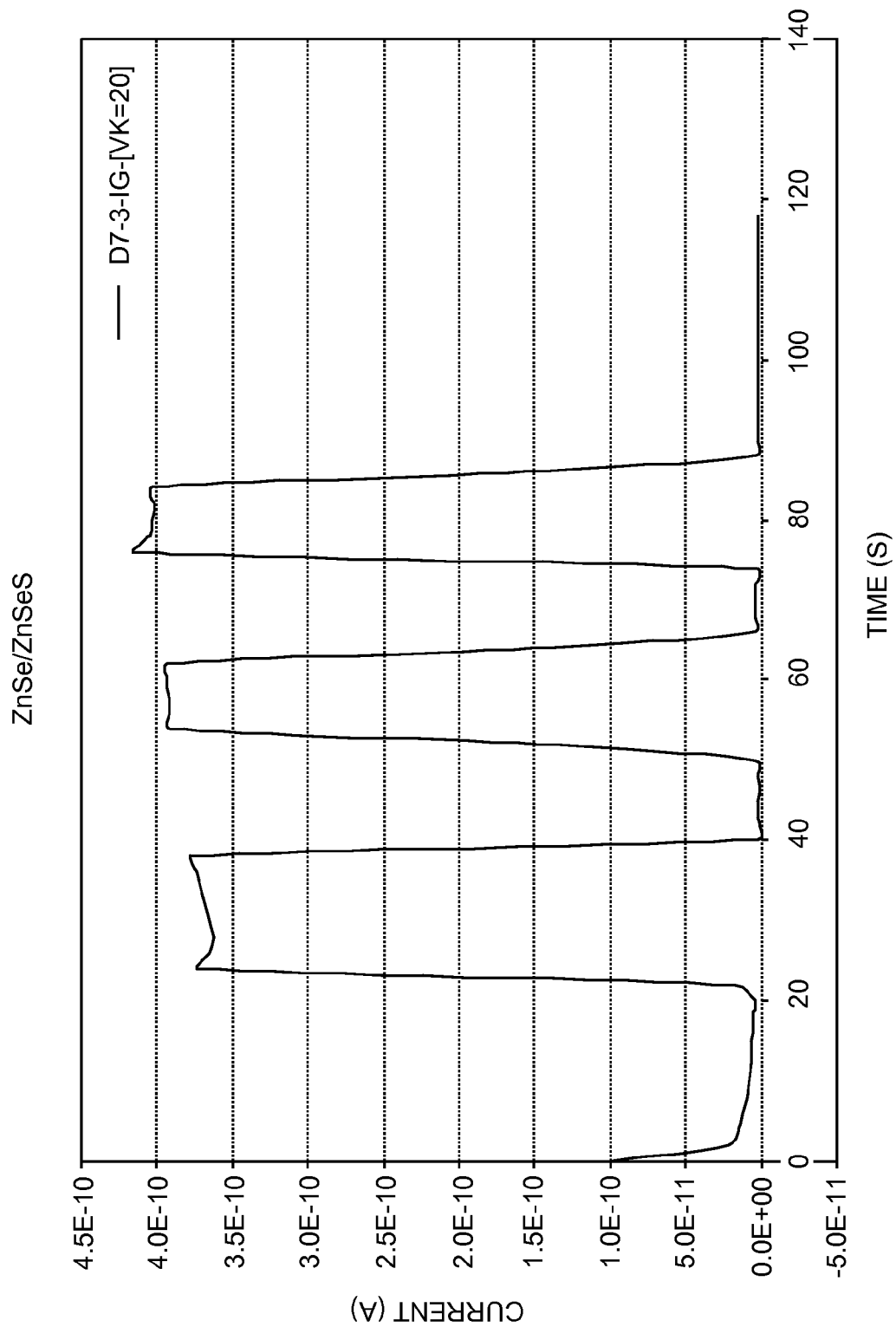
FIG. 9 shows the photo-dependent current behavior of an integrated semiconductor nanowire device containing an array of ZnSe/ZnSeS core/shell nanowires.
Figure 10:
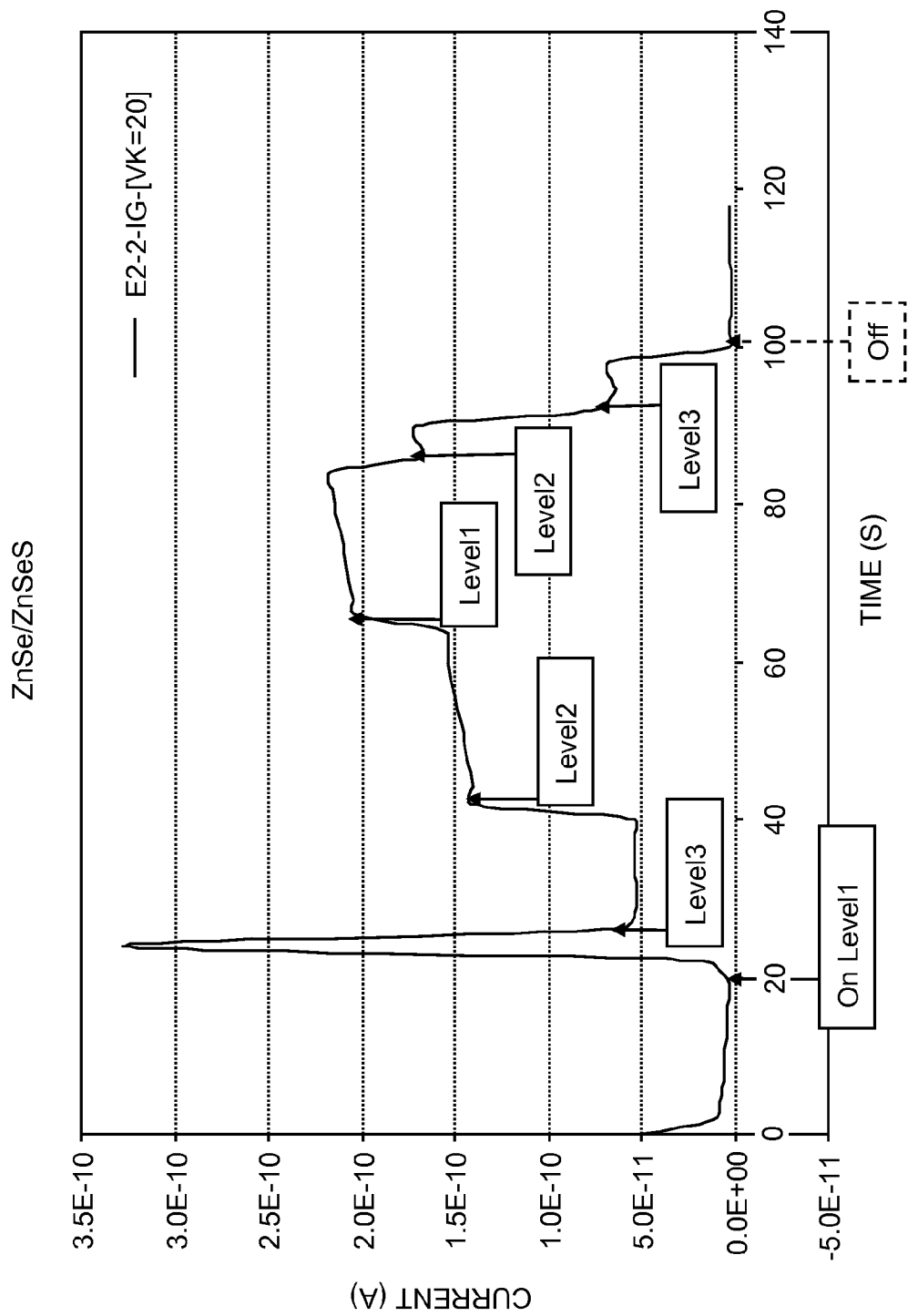
FIG. 10 shows the photo-dependent current behavior of an integrated semiconductor nanowire device at multiple intensities.

The devices of this example were tested using a two point probe station. First, the devices were tested by holding a constant voltage bias and recording the resultant current. FIG. 8 shows the current response for a 20V bias over a period 2 minutes for one representative device from this example. A subsequent measurement was done on the same device with higher current levels recorded (not shown). It was determined that the difference in the electrical response was due to different light levels in the test apparatus. The probe station used in these measurements has a microscope with a three intensity level light source for front side illumination. Initial confirmation tests for photo-dependent current response were conducted at the highest intensity level with multiple on-off events. FIG. 9 shows the effect of light on the current response at a constant voltage bias of 20V. To further confirm this phenomenon, a device from this example was tested at a voltage bias of 20V with each of the different available intensities; the resultant current response is shown in FIG. 10. As seen in FIG. 10, this integrated nanowire device exhibits hysteresis effects that are likely a result of the relatively fast sweep and the large RC time constant of the nanowires. The existence of photo-dependent current response is indicative of the intrinsic semiconductor response, indicating that these devices have good electrical contact at both sides of the device and that the current is flowing through the vertically integrated wires. As discussed below in regards to Comparative Example 1, neither the dielectric nor a device with shorts would exhibit this type of photo-response.

Example 2

The integrated semiconductor nanowire device of Example 2 is similar to that of Example 1, except the device was not completed, stopping fabrication prior to depositing the second metal. The process for creating the devices is analogous to that described in Example 1 except for the following. In this example, the Kapton®-nanowire stack was attached to the bottom of a crystallization dish using double stick tape on the back of the Kapton®. The crystallization dish was partially filled with deionized water placed in to a sonicator bath, and sonicated until the silicon growth substrate floated away from the Kapton® with the embedded semiconductor nanowire layer attached to it.

The Kapton® nanowire stack was carefully removed from the crystallization dish and allowed to dry. The surface quality of the device was similar to that of Example 1.

Example 3

Figure 11:
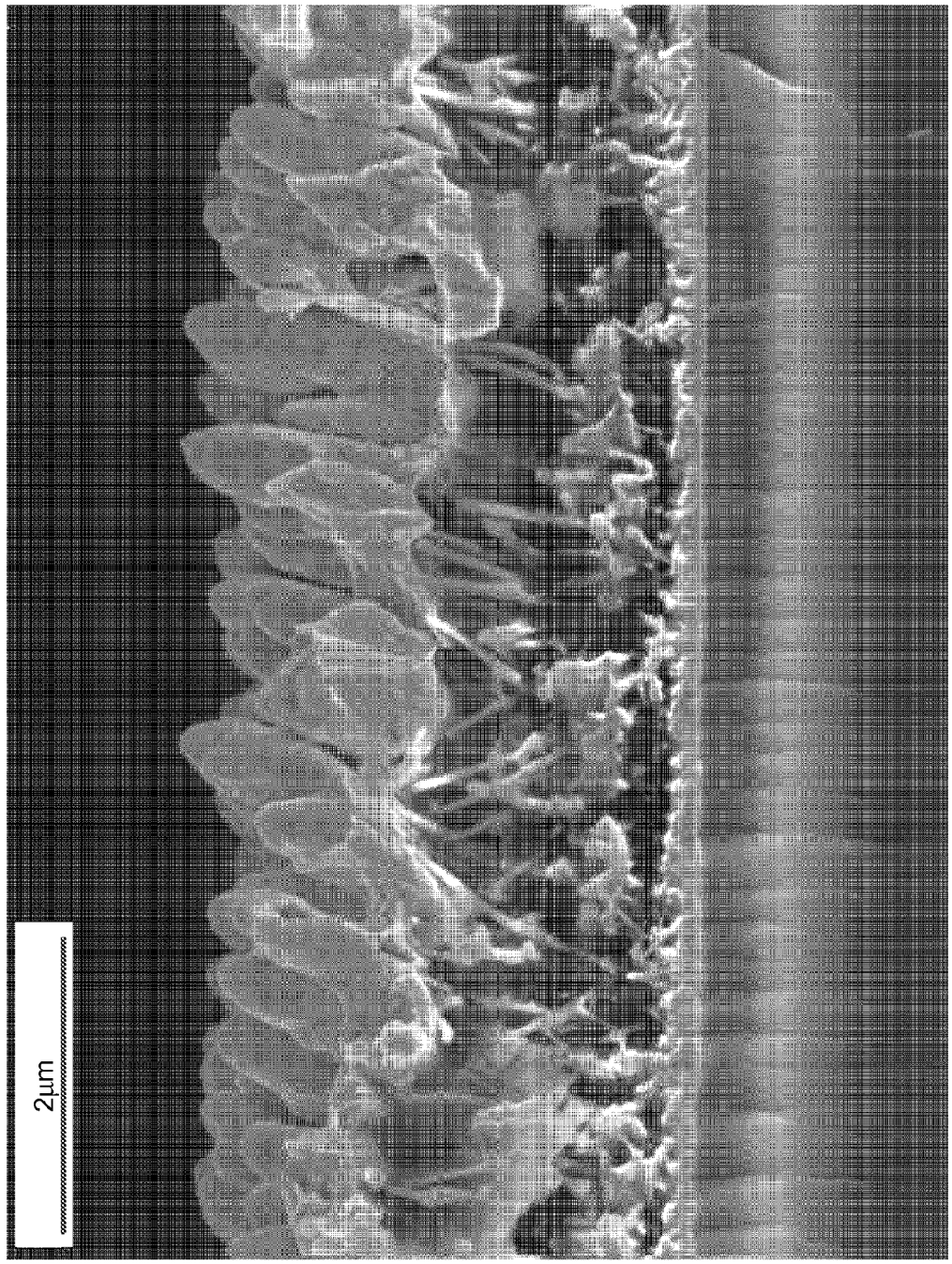
FIG. 11 shows a scanning electron microscope image from a section of the array of ZnSe:Cl/ZnSeS core/shell nanowires tested for FIG. 9 and FIG. 10 prior to being removed from the growth substrate.

The integrated semiconductor nanowire device of Example 3 is similar to that of Example 2, but formed using doped ZnSe:Cl/ZnSeS core/shell nanowires. The process for creating the devices is analogous to that described in Example 2 except for the following. To increase the transfer of energy into the growth substrate, in this example the silicon growth substrate was attached to a small piece of glass using epoxy. The glass was then attached to the bottom of a crystallization dish using double stick tape on the side opposite of the silicon-nanowire-Kapton® stack. As in Example 2, the crystallization dish was partially filled with deionized water and placed into a sonicator bath. The sample was sonicated for 3 minutes at the highest power setting. After sonication the nanowires were removed from the growth substrate using a peeling method (as in Example 1). The energy from sonication helps to ensure that the wires can be easily removed from the $SiO_2$ surface. After separating the embedded nanowires from the growth substrate the stack was allowed to dry at room temperature prior to depositing the second electrodes in the same manner as in Example 1. FIG. 11 shows a cross-section of the sample prior to removal from the substrate.

Figure 12:
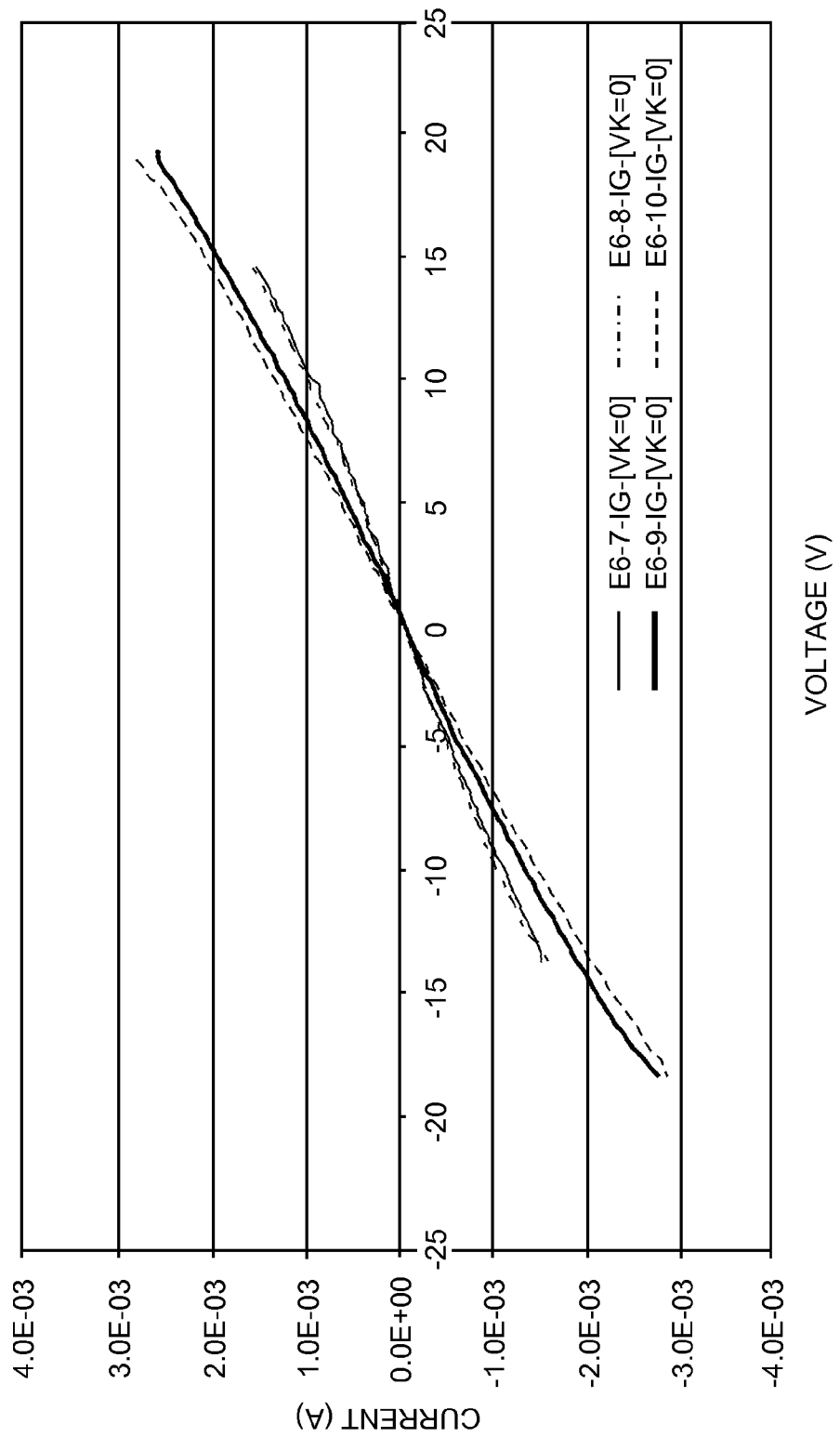
FIG. 12 shows the low resistivity behavior of an integrated semiconductor nanowire device containing an array of chlorine-doped ZnSe/ZnSeS core/shell nanowires.

The devices of this example were also tested using a two point probe station. First, the devices were tested by sweeping the voltage bias and recording the resultant current. FIG. 12 shows the current response for four voltage bias sweeps of one representative device from this example: 1)-15V to 15V, 2) 15V to –15V, 3)-20V to 20V, and 4) 20V to –20V.

Figure 13:
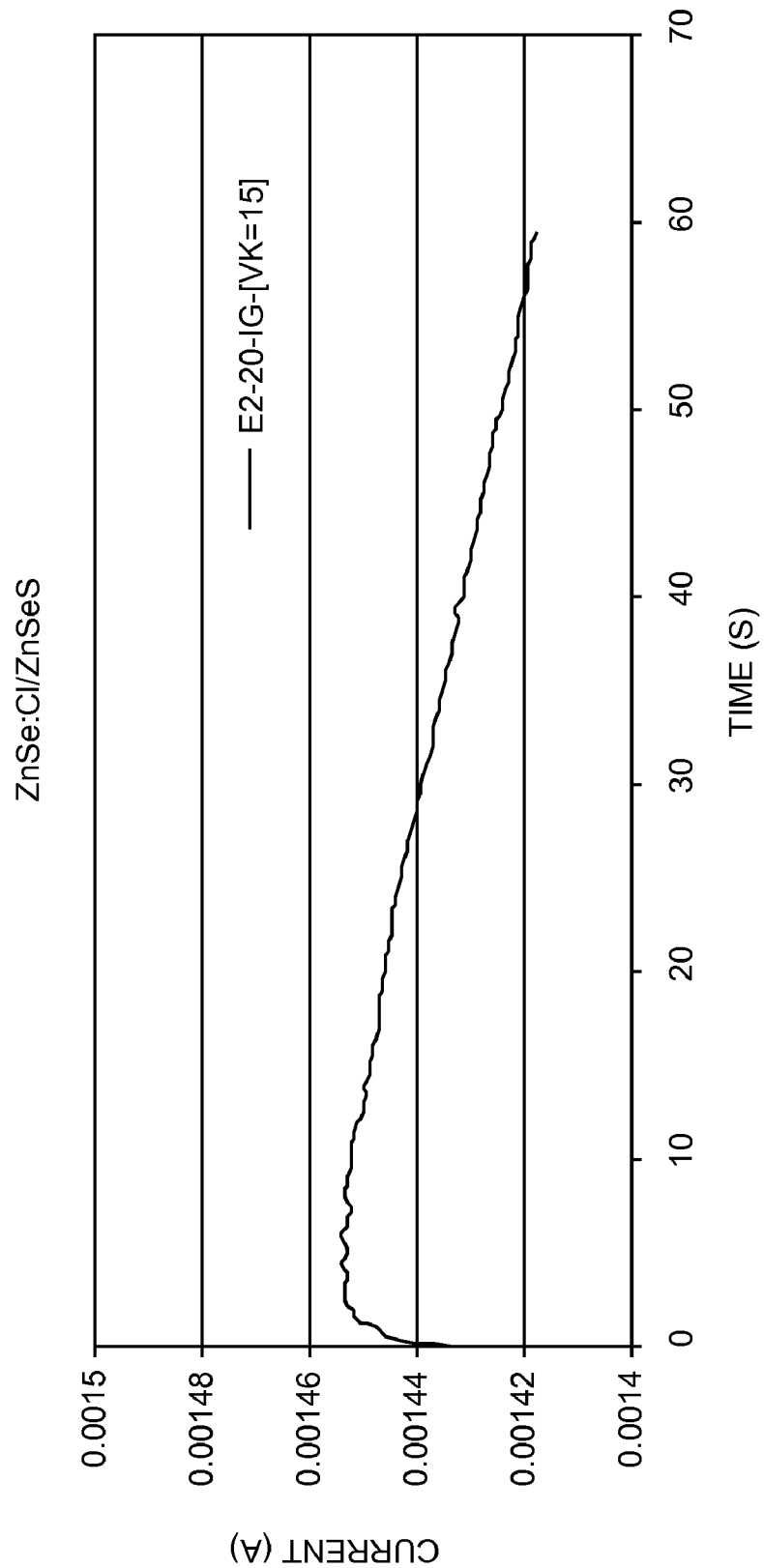
FIG. 13 shows the current as a function of voltage for integrated semiconductor nanowire device containing an array of chlorine-doped ZnSe/ZnSeS core/shell nanowires.

Unlike the intrinsic nanowires, the chlorine doped nanowires did not exhibit photo-dependent behavior since the additional e-h carriers generated by the light is small compared to the number of e-h carriers produced by the Cl-doping process. To test the stability of the current signal, a voltage bias of 15V was applied to a different device of this example, and held for 60 seconds. As shown in FIG. 13, the current variation was small, less than 3%. When compared to the current signal of the intrinsic wires under a 20V bias, the doped nanowire device has 7 orders of magnitude higher current, $10^{-3}$ A as compared with $10^{-10}$ A. These measured current signals indicate that these devices have good electrical contact at both sides of the device and that the current is flowing through the vertically integrated wires, as well as indicating the successful doping of the VLS nanowires. Again, neither the dielectric nor a device with shorts would exhibit this type of response.

Comparative Example 1

Comparative Example 1 is similar in structure to that of Example 1, but formed without using any nanowires. Comparative Example 1 was created by first depositing a coating of Cr/Ag onto a silicon substrate. Next, the SU8 dielectric layer was formed and cured in the same manner as in Example 1. After curing the SU8, it was subjected to the same $O_2$ plasma treatment as Example 1 for the sake of consistency. Rather than removing the structure from the Si substrate, devices were formed on the Si substrate by depositing the second electrode directly over the SU8 in the same manner as in Example 1.

Figure 14:
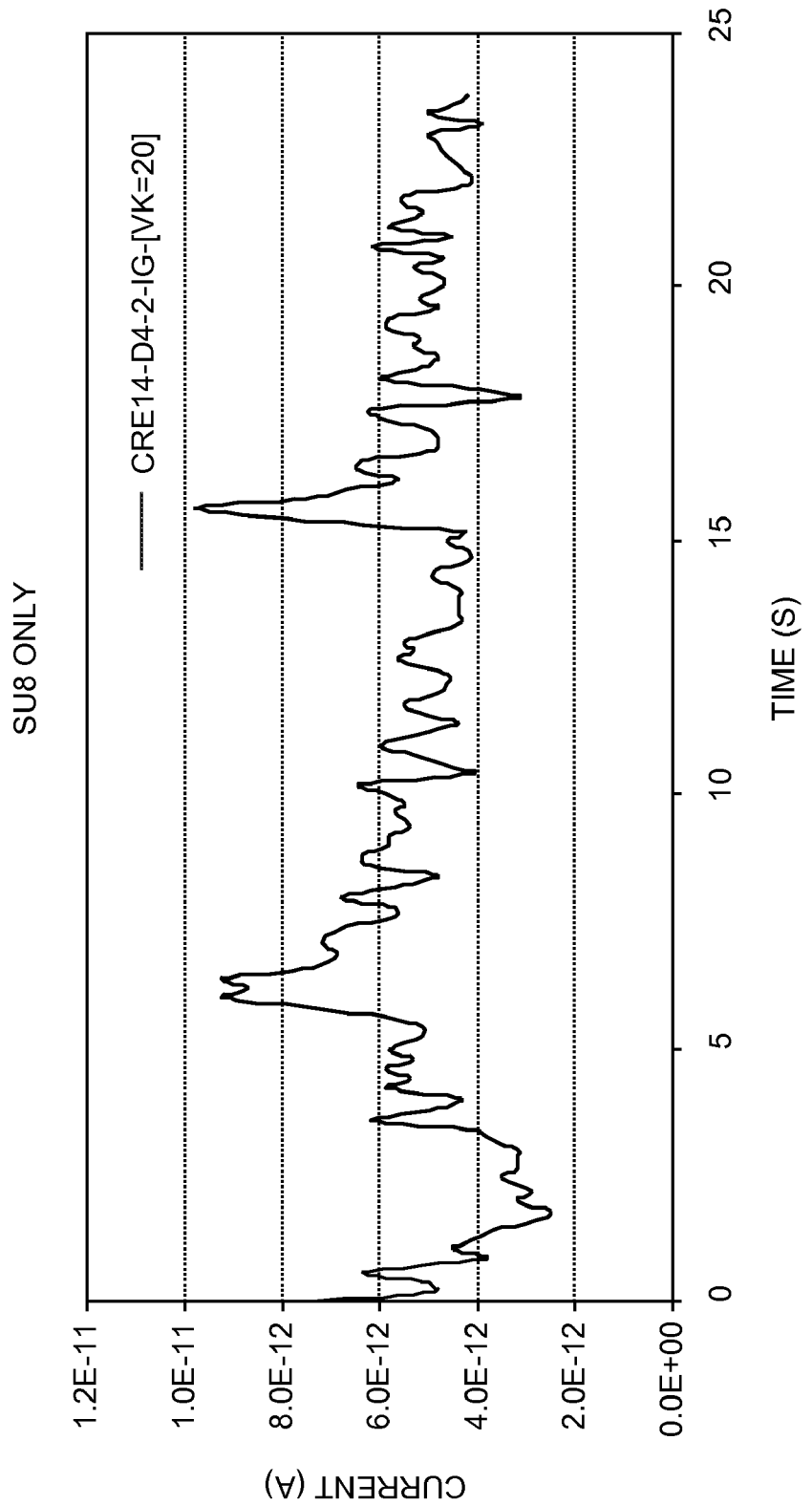
FIG. 14 shows the leakage current for a device containing only the dielectric material.

The devices of this comparative example were also tested using a two point probe station. A voltage bias was applied, and the devices were tested for leakage current. FIG. 14 shows the current response to a 15V bias. The level of current is much less than for the intrinsic nanowire devices of Example 1, $10^{-12}$ Amps versus $10^{-10}$ Amps. The devices of Comparative Example 1, as expected, showed no photo-dependent response.

In summary, this method of forming integrated light emitting semiconductor nanowire devices provides a solution to the problem of making direct electrical connection to either end of an array of semiconductor nanowires, permitting the formation of quality LED devices.

The invention has been described in detail with particular reference to certain preferred embodiments thereof, but it will be understood that variations and modifications can be effected within the spirit and scope of the invention.

PARTS LIST

| | |
|---|---|
| 10 | vertically integrated semiconductor nanowire device |
| 50 | partial device stack |
| 100 | semiconductor nanowires |
| 105 | dielectric |
| 110 | layer of embedded semiconductor nanowires |
| 115 | metal nanoparticles |
| 120 | first electrode |
| 130 | second electrode |
| 150 | top surface of the layer of embedded semiconductor nanowires |
| 160 | bottom surface of the layer of embedded semiconductor nanowires |
| 180 | conductive connection material |
| 190 | device substrate |
| 195 | metallization layer on device substrate (optional) |
| 200 | growth substrate |
| 205 | first electrode |
| 210 | second electrode |
| 215 | first electrode |
| 220 | second electrode |
| 230 | polymer dielectric |
| 240 | semiconductor nanowires |
| 250 | silicon wires |
| 255 | prior art silicon wire device |
| 260 | prior art device |
| 270 | growth substrate |
| 280 | buffer layer |
| 290 | dielectric |
| 300 | integrated light emitting nanowire device |
| 305 | dielectric |
| 310 | light emitting core/shell semiconductor nanowires |
| 315 | layer of embedded light emitting semiconductor nanowires |
| 320 | first electrode |
| 330 | second electrode |
| 340 | shell |
| 345 | n-type region |
| 350 | p-type region |
| 355 | intrinsic region |
| 380 | conductive connection material |
| 390 | device substrate |
| 395 | metallization layer on device substrate (optional) |
| 400 | Step 1 |
| 405 | Step 2 |
| 415 | Step 3 |
| 420 | Step 4 |
| 425 | Step 5 |
| 430 | Step 6 |
| 500 | Light |

The invention claimed is:

1. A method of making a light emitting semiconductor nanowire device comprising:
    (a) providing a plurality of spaced light emitting semiconductor nanowires on a growth substrate;
    (b) applying a dielectric material so that it is disposed between the semiconductor nanowires producing a layer of embedded semiconductor nanowires having a top surface opposed to a bottom surface, wherein the bottom surface is defined by the interface with the growth substrate;
    (c) depositing a first electrode over the top surface of the layer of embedded semiconductor nanowires so that it is in electrical contact with the semiconductor nanowires;
    (d) joining the first electrode to a device substrate;
    (e) removing the growth substrate and exposing the bottom surface of the layer of embedded semiconductor nanowires;
    (f) depositing a second electrode on the bottom surface of the layer of embedded semiconductor nanowires so that it is in electrical contact with the semiconductor nanowires; and
    (g) wherein either the first or second electrode is transparent to permit light to be transmitted from the light emitting semiconductor nanowires through the transparent electrode.

2. The method of claim 1 wherein the light emitting nanowires include type II-VI, III-V, IV-VI or IV semiconductor materials.

3. The method of claim 2 wherein the light emitting nanowires include core/shell nanowires.

4. The method of claim 3 wherein the core/shell nanowires have cores having discrete internal heterostructure units.

5. The method of claim 1 wherein the dielectric material is a polymer.

6. The method of claim 1 wherein the light emitting nanowires are axial or radial pin diodes.

7. The method of claim 1 wherein step (d) includes using a conductive connection material to form an electrical connection between the first electrode and the device substrate.

8. The method of claim 7 wherein the conductive connection material is a metal and step (d) is provided by:
    (i) depositing the metallic conductive connection material on the device substrate;
    (ii) melting the metallic conductive connection material; and
    (iii) placing the first electrode in contact with the metallic conductive connection material to join the first electrode to the device substrate.

9. The method of claim 1 wherein the device substrate is flexible.

10. The method of claim 1 wherein the device substrate is conductive.

11. The method of claim 1 wherein the second electrode of step (f) is deposited in a pattern.

12. The method of claim 1 wherein step (e) includes using mechanical force to peel the device substrate.

13. The method of claim 1 wherein step (e) includes providing energy to weaken the bond between the semiconductor nanowires and the growth substrate to facilitate the removal of the semiconductor nanowires.

14. An integrated light emitting nanowire device comprising:
    (a) a plurality of spaced light emitting semiconductor nanowires each having top and bottom surfaces;
    (b) dielectric material disposed between the spaced light emitting semiconductor nanowires;
    (c) a first electrode in direct contact with the top surface of the nanowires;
    (d) a conductive connection layer in contact with the first electrode;
    (e) a second electrode in direct contact with the bottom surface of the nanowires;
    (f) a device substrate in contact with the conductive connection layer; and
    (g) either the first or second electrode is transparent to permit light to be transmitted through the transparent electrode.

15. The light emitting nanowire device of claim 14 wherein the light emitting semiconductor nanowires include type II-VI, III-V, IV-VI or IV semiconductor materials.

16. The light emitting nanowire device of claim 14 where each light emitting nanowire is a semiconductor pin diode.

17. The light emitting nanowire device of claim 16 where the semiconductor pin diodes are axial or radial pin diodes.

18. The integrated light emitting nanowire device of claim 14 where the conductive connection layer is a metal.

* * * * *